United States Patent
Niwa et al.

(10) Patent No.: US 11,575,068 B2
(45) Date of Patent: *Feb. 7, 2023

(54) METHOD OF MANUFACTURING SEMICONDUCTOR LIGHT EMITTING ELEMENT

(71) Applicant: NIKKISO CO., LTD., Tokyo (JP)

(72) Inventors: Noritaka Niwa, Hakusan (JP); Tetsuhiko Inazu, Hakusan (JP); Haruhito Sakai, Hakusan (JP)

(73) Assignee: NIKKISO CO., LTD., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/857,853

(22) Filed: Apr. 24, 2020

(65) Prior Publication Data

US 2020/0251611 A1    Aug. 6, 2020

Related U.S. Application Data

(63) Continuation of application No. PCT/JP2018/036566, filed on Sep. 28, 2018.

(30) Foreign Application Priority Data

Oct. 26, 2017 (JP) ............................ JP2017-206889

(51) Int. Cl.
- *H01L 33/32* (2010.01)
- *H01L 33/00* (2010.01)
- *H01L 33/40* (2010.01)
- *H01L 21/28* (2006.01)

(52) U.S. Cl.
CPC .......... *H01L 33/0075* (2013.01); *H01L 21/28* (2013.01); *H01L 33/32* (2013.01); *H01L 33/405* (2013.01)

(58) Field of Classification Search
CPC . H01L 33/0075; H01L 33/0095; H01L 33/32; H01L 21/28; H01L 33/007; H01L 33/405; H01L 33/38; H01L 2933/0016

See application file for complete search history.

(56) References Cited

U.S. PATENT DOCUMENTS 10,720,547 B2 * 7/2020 Sakai ................... H01L 33/0075
10,854,773 B2 * 12/2020 Igarashi ............ H01L 21/30621
(Continued)

FOREIGN PATENT DOCUMENTS

| JP | H09-129930 A | 5/1997 |
| JP | 2006202528 A | 8/2006 |

(Continued)

OTHER PUBLICATIONS

International Preliminary Examination Report on Patentability issued in corresponding application No. PCT/JP2018/036566 with an English translation.

(Continued)

*Primary Examiner* — Savitri Mulpuri

(74) *Attorney, Agent, or Firm* — Muncy, Geissler, Olds & Lowe, P.C.

(57) ABSTRACT

A method of manufacturing a semiconductor light emitting element includes: forming an active layer made of an aluminum gallium nitride (AlGaN)-based semiconductor material on an n-type clad layer made of an n-type AlGaN-based semiconductor material; removing a portion of each of the active layer and the n-type clad layer by dry etching to expose a portion of the n-type clad layer; forming a first metal layer including titanium (Ti) on an exposed surface of the n-type clad layer; forming a second metal layer including aluminum (Al) on the first metal layer; and forming an n-side electrode by annealing the first metal layer and the second metal layer at a temperature not lower than 560° C. and not higher than 650° C. A film density of the second metal layer before the annealing is lower than 2.7 g/cm³.

4 Claims, 3 Drawing Sheets

(56) References Cited

U.S. PATENT DOCUMENTS

| | | | |
|---|---|---|---|
| 10,944,026 B2* | 3/2021 | Matsukura | H01L 33/007 |
| 11,322,656 B2* | 5/2022 | Sakai | H01L 33/0075 |
| 2006/0170329 A1* | 8/2006 | Tojo | H01J 31/127 |
| | | | 313/495 |
| 2009/0315062 A1* | 12/2009 | Su | H01L 33/60 |
| | | | 257/99 |
| 2015/0048304 A1* | 2/2015 | Niwa | H01L 33/0095 |
| | | | 257/13 |
| 2017/0098739 A1 | 4/2017 | Gaevski et al. | |
| 2019/0393378 A1* | 12/2019 | Wada | H01L 33/0025 |
| 2020/0251611 A1* | 8/2020 | Niwa | H01L 21/28 |

FOREIGN PATENT DOCUMENTS

| | | |
|---|---|---|
| JP | 5594530 B | 5/2012 |
| JP | 2012227494 A | 11/2012 |
| JP | 2015032520 A | 2/2015 |
| JP | 2015103768 A | 6/2015 |
| KR | 20140043163 A | 4/2014 |
| WO | WO2013046419 | 3/2015 |

OTHER PUBLICATIONS

International Search Report issued in corresponding PCT Application No. PCT/JP2018/036566 with an English translation.
Office Action issued in corresponding Japanese Patent Application No. 2017-206889 dated Dec. 18, 2018 with an English translation.
Office Action issued in corresponding Japanese Patent Application No. 2017-206889 dated Jul. 2, 2019 with an English translation.
Written Opinion of ISA issued in corresponding application No. PCT/JP2018/036566 with an English translation.
Office Action dated Sep. 6, 2021 in KR Application No. 10-2020-7012349, 11 pages.

* cited by examiner

10

10

METHOD OF MANUFACTURING SEMICONDUCTOR LIGHT EMITTING ELEMENT

RELATED APPLICATION

Priority is claimed to Japanese Patent Application No. 2017-206889, filed on Oct. 26, 2017, the entire content of which is incorporated herein by reference.

BACKGROUND OF THE INVENTION

1. Field of the Invention

The present invention relates to a method of manufacturing semiconductor light emitting elements.

2. Description of the Related Art

A light emitting element for emitting deep ultraviolet light includes an aluminum gallium nitride (AlGaN)-based n-type clad layer, an active layer, and a p-type clad layer stacked successively on a substrate. An n-side electrode having a stack structure of Ti/Al/Ti/Au is formed on a partial region of the n-type clad layer exposed by etching. It is known that the contact resistance between the n-type clad layer and the n-side electrode tends to increase as the AlN molar fraction in the n-type clad layer increases, making preferable ohmic contact difficult. Annealing at 700° C. or higher is necessary to reduce the contact resistance of the n-side electrode.

Annealing at a temperature beyond the melting point (about 660° C.) of aluminum (Al), which is included in the n-side electrode, could degrade a flatness of the n-side electrode after annealing, and then reflectivity of the n-side electrode for ultraviolet light could be degraded after annealing.

SUMMARY OF THE INVENTION

The present invention addresses the above-described issue, and an illustrative purpose thereof is to provide a technology of improving the contact resistance and flatness of the n-side electrode of a semiconductor light emitting element.

The method of manufacturing a semiconductor light emitting element according to an embodiment includes: forming a first metal layer including titanium (Ti) on an n-type clad layer made of an n-type aluminum gallium nitride (AlGaN)-based semiconductor material; forming a second metal layer including aluminum (Al) on the first metal layer; and forming an n-side electrode by annealing the first metal layer and the second metal layer at a temperature not lower than 560° C. and not higher than 650° C. A film density of the second metal layer before the annealing is lower than 2.7 g/cm$^3$.

According to the embodiment, it is ensured that the contact resistance of the n-side electrode is 0.1 Ω·cm$^2$ or lower by forming the second metal layer such that the film density of the second metal layer including Al is less than 2.7 g/cm$^3$ and by annealing the second metal layer at a temperature not lower than 560° C. and not higher than 650° C. Further, annealing at a temperature not higher than 650° C., which is lower than the melting point of Al, prevents the flatness of the n-side electrode from being degraded and prevents the reflectivity of the n-side electrode from becoming lower due to the melting of Al at the time of annealing.

According to the embodiment, both the contact resistance and the flatness of the n-side electrode are improved.

The second metal layer may be formed by sputtering.

An arithmetic mean roughness (Ra) of the second metal layer after the annealing may be 5 nm or less.

A thickness of the first metal layer may be 10 nm or less, and contact resistance between the n-side electrode and the n-type clad layer may be 0.1 Ω·cm$^2$ or less.

The method may further include: forming an active layer made of an AlGaN-based semiconductor material on the n-type clad layer; and removing a portion of each of the active layer and the n-type clad layer by dry etching to expose a portion of the n-type clad layer. The portion of the n-type clad layer may be removed at an etching rate of 50 nm/minute or lower, and the first metal layer may be formed on an exposed surface of the n-type clad layer exposed after the dry etching.

The n-side electrode may be configured such that reflectivity for ultraviolet light entering from the n-type clad layer is 30% or higher.

The n-type clad layer may have a molar fraction of aluminum nitride (AlN) of 25% or higher and include silicon at a concentration of $1\times10^{18}$/cm$^3$ or higher. The semiconductor light emitting may be configured to emit ultraviolet light having a wavelength of 350 nm or shorter.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
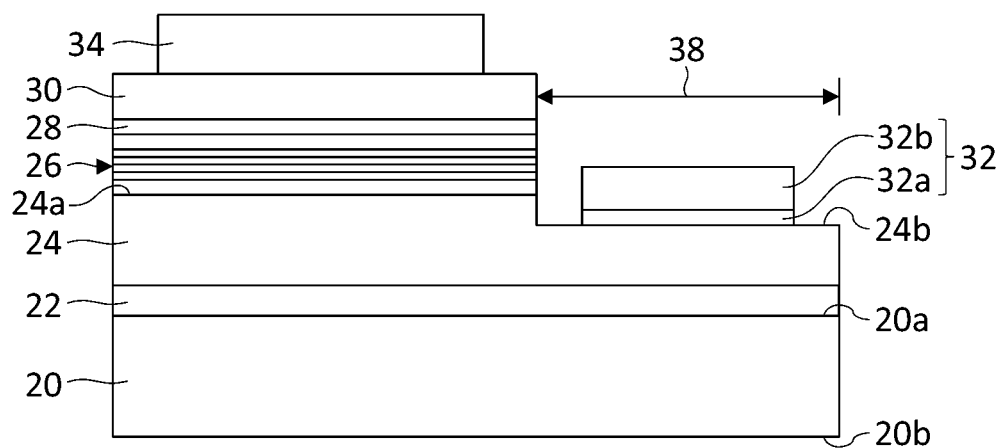
FIG. 1 is a cross-sectional view schematically showing a configuration of a semiconductor light emitting element according to the embodiment.

The invention will now be described by reference to the preferred embodiments. This does not intend to limit the scope of the present invention, but to exemplify the invention.

A detailed description will be given of an embodiment to practice the present invention with reference to the drawings. The same numerals are used in the description to denote the same elements and a duplicate description is omitted as appropriate. To facilitate the understanding, the relative dimensions of the constituting elements in the drawings do not necessarily mirror the relative dimensions in the actual light emitting element.

FIG. 1 is a cross-sectional view schematically showing a configuration of a semiconductor light emitting element 10 according to the embodiment. The semiconductor light emitting element 10 is a light emitting diode (LED) chip configured to emit "deep ultraviolet light" having a central wavelength A of about 360 nm or shorter. To output the deep ultraviolet light having such a wavelength, the semiconductor light emitting element 10 is made of an aluminum gallium nitride (AlGaN) based semiconductor material having a band gap of about 3.4 eV or larger. The embodiment particularly shows a case of emitting deep ultraviolet light having a central wavelength A of about 240 nm-350 nm.

In this specification, the term "AlGaN-based semiconductor material" refers to a semiconductor material mainly containing aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0 < x+y \leq 1$, $0 \leq x \leq 1$, $0 \leq y \leq 1$). The AlGaN-based semiconductor material shall contain AlN, GaN, AlGaN, indium aluminum nitride (InAlN), indium gallium nitride (InGaN), or indium aluminum gallium nitride (InAlGaN).

Of "AlGaN-based semiconductor materials", those materials that do not substantially contain AlN may be distinguished by referring to them as "GaN-based semiconductor materials". "GaN-based semiconductor materials" mainly contain GaN or InGaN and encompass materials that additionally contain a slight amount of AlN. Similarly, of "AlGaN-based semiconductor materials", those materials that do not substantially contain GaN may be distinguished by referring to them as "AlN-based semiconductor materials". "AlN-based semiconductor materials" mainly contain AlN or InAlN and encompass materials that additionally contain a slight amount of GaN.

The semiconductor light emitting element 10 includes a substrate 20, a buffer layer 22, an n-type clad layer 24, an active layer 26, an electron blocking layer 28, a p-type clad layer 30, an n-side electrode 32, and a p-side electrode 34.

The substrate 20 is a substrate having translucency for the deep ultraviolet light emitted by the semiconductor light emitting element 10 and is, for example, a sapphire ($Al_2O_3$) substrate. The substrate 20 includes a first principal surface 20a and a second principal surface 20b opposite to the first principal surface 20a. The first principal surface 20a is a principal surface that is a crystal growth surface for growing the buffer layer 22 and the layers above. The second principal surface 20b is a principal surface that is a light extraction surface for extracting the deep ultraviolet light emitted by the active layer 26 outside. In one variation, the substrate 20 may be an aluminum nitride (AlN) substrate or an aluminum gallium nitride (AlGaN) substrate.

The buffer layer 22 is formed on the first principal surface 20a of the substrate 20. The buffer layer 22 is a foundation layer (template layer) to form the n-type clad layer 24 and the layers above. For example, the buffer layer 22 is an undoped AlN layer and is, specifically, an AlN (HT-AlN; High Temperature AlN) layer gown at a high temperature. The buffer layer 22 may include an undoped AlGaN layer formed on the AlN layer. In an embodiment, the buffer layer 22 may be comprised only of an undoped AlGaN layer in the case the substrate 20 is an AlN substrate or an AlGaN substrate. In other words, the buffer layer 22 includes at least one of an undoped AlN layer and AlGaN layer.

The n-type clad layer 24 is formed on the buffer layer 22. The n-type clad layer 24 is an n-type AlGaN-based semiconductor material layer. For example, the n-type clad layer 24 is an AlGaN layer doped with silicon (Si) as an n-type impurity. The composition ratio of the n-type clad layer 24 is selected to transmit the deep ultraviolet light emitted by the active layer 26. For example, the n-type clad layer 24 is formed such that the molar fraction of AlN is 25% or higher, and, preferably, 40% or higher or 50% or higher. The n-type clad layer 24 has a band gap larger than the wavelength of the deep ultraviolet light emitted by the active layer 26. For example, the n-type clad layer 24 is formed to have a band gap of 4.3 eV or larger. It is preferable to form the n-type clad layer 24 such that the molar fraction of AlN is 80% or lower, i.e., the band gap is 5.5 eV or smaller. It is more preferable to form the n-type clad layer 24 such that the molar fraction of AlN is 70% or lower (i.e., the band gap is 5.2 eV or smaller). The n-type clad layer 24 has a thickness of about 1 μm-3 μm. For example, the n-type clad layer 24 has a thickness of about 2 μm.

The n-type clad layer 24 is formed such that the concentration of silicon (Si) as the impurity is not lower than $1 \times 10^{18}/cm^3$ and not higher than $5 \times 10^{19}/cm^3$. It is preferred to form the n-type clad layer 24 such that the Si concentration is not lower than $5 \times 10^{18}/cm^3$ and not higher than $3 \times 10^{19}/cm^3$, and, more preferably, not lower than $7 \times 10^{18}/cm^3$ and not higher than $2 \times 10^{19}/cm^3$. In an embodiment, the Si concentration in the n-type clad layer 24 is around $1 \times 10^{19}/cm^3$ and is in a range not lower than $8 \times 10^{18}/cm^3$ and not higher than $1.5 \times 10^{19}/cm^3$.

The active layer 26 is made of an AlGaN-based semiconductor material and has a double heterojunction structure by being sandwiched between the n-type clad layer 24 and the electron blocking layer 28. The active layer 26 may have a monolayer or multilayer quantum well structure. For example, the active layer 26 may be formed by stack of a barrier layer made of an undoped AlGaN-based semiconductor material and a well layer made of an undoped AlGaN-based semiconductor material. To output deep ultraviolet light having a wavelength of 355 nm or shorter, the active layer 26 is formed to have a band gap of 3.4 eV or larger. For example, the AlN composition ratio of the active layer 26 is selected so as to output deep ultraviolet light having a wavelength of 310 nm or shorter. The active layer 26 is formed on a first top surface 24a of the n-type clad layer 24 and is not formed on a second top surface 24b adjacent to the first top surface 24a. In other words, the active layer 26 is not formed on the entirety of the n-type clad layer 24 and is formed only in a partial region (which is different region than an exposed region 38) of the n-type clad layer 24.

The electron blocking layer 28 is formed on the active layer 26. The electron blocking layer 28 is a p-type AlGaN-based semiconductor material layer and is formed such that the molar fraction of AlN is 40% or higher, and, preferably, 50% or higher. The electron blocking layer 28 may be formed such that the molar fraction of AlN is 80% or higher or may be made of an AlN-based semiconductor material that does not substantially contain GaN. The electron blocking layer has a thickness of about 1 nm-10 nm. For example, the electron blocking layer 28 has a thickness of about 2 nm-5 nm. The electron blocking layer 28 may not be a p-type layer and may be an undoped semiconductor layer.

The p-type clad layer 30 is a p-type semiconductor layer formed on the electron blocking layer 28. The p-type clad layer 30 is a p-type AlGaN-based semiconductor material layer. For example, the p-type clad layer 30 is an AlGaN layer doped with magnesium (Mg) as a p-type impurity. The p-type clad layer 30 has a thickness of about 300 nm-700 nm. For example, the p-type clad layer 30 has a thickness of about 400 nm-600 nm. The p-type clad layer 30 may be made of a p-type GaN-based semiconductor material that does not substantially contain AlN.

The n-side electrode 32 is formed on the second top surface 24b of the n-type clad layer 24. The n-side electrode 32 is formed by a multilayer film in which a first metal layer 32a and a second metal layer 32b are stacked on the second top surface 24b. The n-side electrode 32 is a so-called Ti/Al-based electrode. The first metal layer 32a includes titanium (Ti), and the second metal layer 32b includes aluminum (Al).

The p-side electrode 34 is formed on the p-type clad layer 30. The p-side electrode 34 is formed by a multilayer film of nickel (Ni)/gold (Au) stacked on the p-type clad layer 30 successively.

Figure 2:
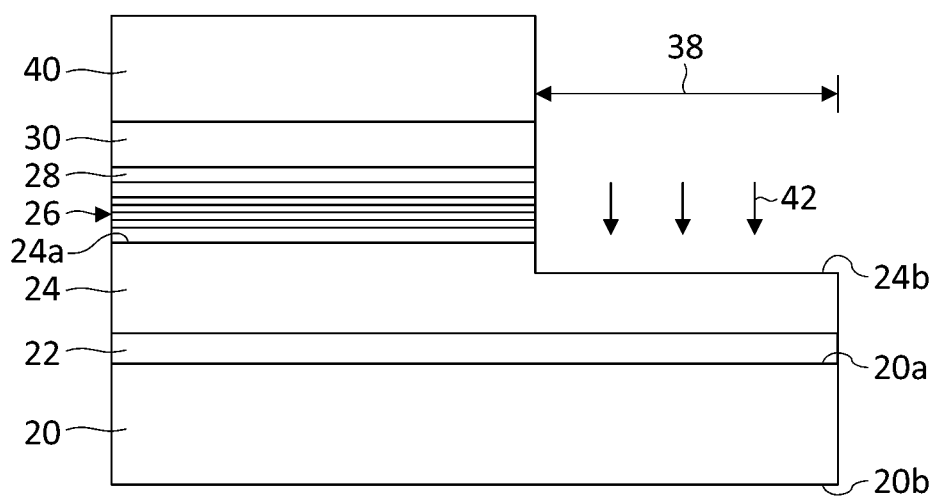
FIG. 2 schematically shows a step of manufacturing the semiconductor light emitting element.

A description will now be given of a method of manufacturing the semiconductor light emitting element 10. FIG. 2 schematically shows a step of manufacturing the semiconductor light emitting element 10. First, the buffer layer 22, the n-type clad layer 24, the active layer 26, the electron blocking layer 28, and the p-type clad layer 30 are formed on the first principal surface 20a of the substrate 20 successively.

The substrate 20 is a sapphire ($Al_2O_3$) substrate and is a growth substrate for forming an AlGaN-based semiconductor material. For example, the buffer layer 22 is formed on the (0001) plane of the sapphire substrate. The buffer layer 22 includes, for example, an AlN (HT-AlN) layer gown at a high temperature and an undoped AlGaN (u-AlGaN) layer. The n-type clad layer 24, the active layer 26, the electron blocking layer 28, and the p-type clad layer 30 are layers made of an AlGaN-based semiconductor material, an AlN-based semiconductor material, or a GaN-based semiconductor material and can be formed by a well-known epitaxial growth method such as the metalorganic vapor phase epitaxy (MOVPE) method and the molecular beam epitaxial (MBE) method.

Subsequently, a mask 40 is formed on the p-type clad layer 30. A portion of each of the p-type clad layer 30, the electron blocking layer 28, the active layer 26, and the n-type clad layer 24 in the exposed region 38, in which the mask 40 is not formed, is removed. This forms the second top surface 24b (exposed surface) of the n-type clad layer 24 in the exposed region 38. In the step of forming the exposed surface of the n-type clad layer 24, the layers can be removed by dry etching. For example, reactive ion etching using an etching gas turned into a plasma can be used. For example, inductive coupling plasma (ICP) etching may be used.

In the step of forming the exposed surface of the n-type clad layer 24, it is preferred to use an etching rate of 50 nm/minute or lower, or more preferably, an etching rate of 13 nm/minute or lower or 2 nm/minute or lower in order to prevent the crystal quality of the second top surface 24b from being degraded by dry etching. It is not necessary to lower the etching rate of all layers from the p-type clad layer 30 to the n-type clad layer 24. For example, the p-type clad layer 30, the electron blocking layer 28, and the active layer 26 may be dry-etched at a higher etching rate (e.g., 100 nm/minute or higher), and only the n-type clad layer 24 may be dry-etched at a lower etching rate (e.g., 100 nm/minute or lower).

In the step of dry etching at the higher etching rate described above, dry etching may be performed by combining a reactive gas and an inert gas in combination. A gas including chlorine (Cl) such as chlorine ($Cl_2$), boron trichloride ($BCl_3$), and silicon tetrachloride ($SiCl_4$) can be used as the reactive gas, and a noble gas such as argon (Ar) can be used as the inert gas. Meanwhile, in the dry etching at the lower etching rate, only the reactive gas is used and the inert gas is not used, where the crystal quality is prevented from being degraded due to the physical removal action by the inert gas.

Subsequently, the first metal layer 32a that is a Ti layer is formed on the second top surface 24b (exposed surface) of the n-type clad layer 24, and the second metal layer 32b that is an Al layer is then formed. The thickness of the first metal layer 32a is about 1 nm-10 nm, and the thickness of the second metal layer 32b is about 20 nm-1000 nm. It is preferred to form the first metal layer 32a and the second metal layer 32b by sputtering. These layers can be formed by electron beam (EB) deposition, but sputtering can form a metal layer having a lower film density. In the case the Al layer is formed by sputtering, the film density of the Al layer will be 2.6 $g/cm^3$ or higher and lower than 2.7 $g/cm^3$. For example, the film thickness will be about 2.61-2.69 $g/cm^3$. In the case the Al layer is formed by EB deposition, the film thickness will be 2.7 $g/cm^3$ or higher. For example, the film thickness will be about 2.71-2.75 $g/cm^3$. The lower film density of the Al layer provides a preferable contact resistance at a relatively lower annealing temperature.

The n-side electrode 32 is annealed after the first metal layer 32a and the second metal layer 32b are formed. It is preferred to anneal the n-side electrode 32 at a temperature lower than the melting point of Al (about 660° C.) and at a temperature not lower than 560° C. and not higher than 650° C. The film density of the Al layer of less than 2.7 $g/cm^3$ and the annealing temperature not lower than 560° C. and not higher than 650° C. ensure that the contact resistance of the n-side electrode 32 is 0.1 $\Omega \cdot cm^2$ or lower. The annealing temperature not lower than 560° C. and not higher than 650° C. improves the flatness of the n-side electrode 32 after the annealing and provides a reflectivity of 30% or higher for the ultraviolet light. Further, the preferable contact resistance is obtained even when annealing is performed for one minute or longer (e.g., about five minutes-thirty minutes) by annealing at a temperature below the melting point of Al. In the case a plurality of element portions are formed on one substrate, securing a longer anneal time (one minute or more) makes it possible to improve temperature uniformity in the substrate during annealing to allow a plurality of semiconductor light emitting elements with little characteristic variation to be formed at the same time.

Subsequently, the p-side electrode 34 is formed on the p-type clad layer 30 after the mask 40 is removed. The p-side electrode 34 may be formed by a well-known method such as electron beam deposition and sputtering. This completes the formation of the semiconductor light emitting element 10 shown in FIG. 1.

Figure 3:
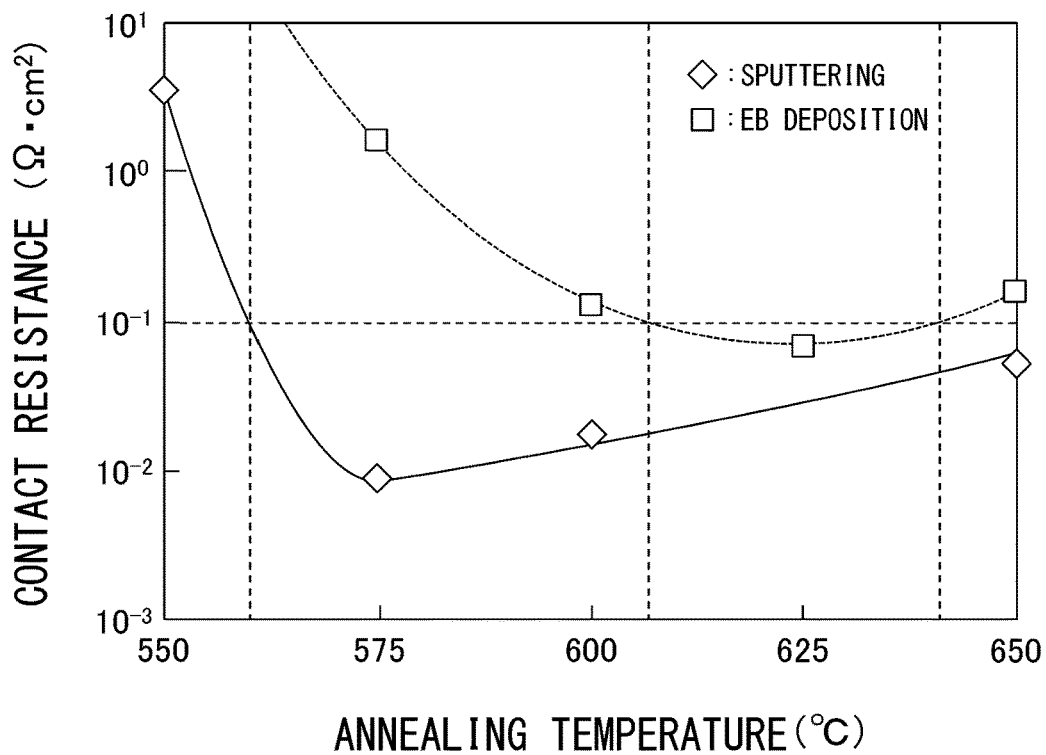
FIG. 3 is a graph showing a relationship between the annealing temperature and the contact resistance of the n-side electrode.

FIG. 3 is a graph showing a relationship between the annealing temperature and the contact resistance of the n-side electrode 32 and shows a case in which the n-side electrode 32 is formed by sputtering and a case in which it is formed by EB deposition. As shown in the graph, the contact resistance of 0.1 $\Omega \cdot cm^2$ or lower is realized in a temperature range not lower than 560° C. and not higher than 650° C., by forming the n-side electrode 32 by sputtering. In particular, a more suitable contact resistance of 0.01 $\Omega \cdot cm^2$ or less is obtained by using the annealing temperature 575° C. In the case the n-side electrode 32 is formed by EB deposition, on the other hand, the contact resistance of 0.1 $\Omega \cdot cm^2$ or less is realized in a temperature range not lower than 610° C. and not higher than 640° C. Thus, the use of sputtering can extend the range of annealing temperature capable of realizing the lower contact resistance and can lower the optimum annealing temperature, as compared with the case of using EB deposition. In the optimum condition, sputtering realizes a lower contact resistance than EB deposition.

Figure 4:
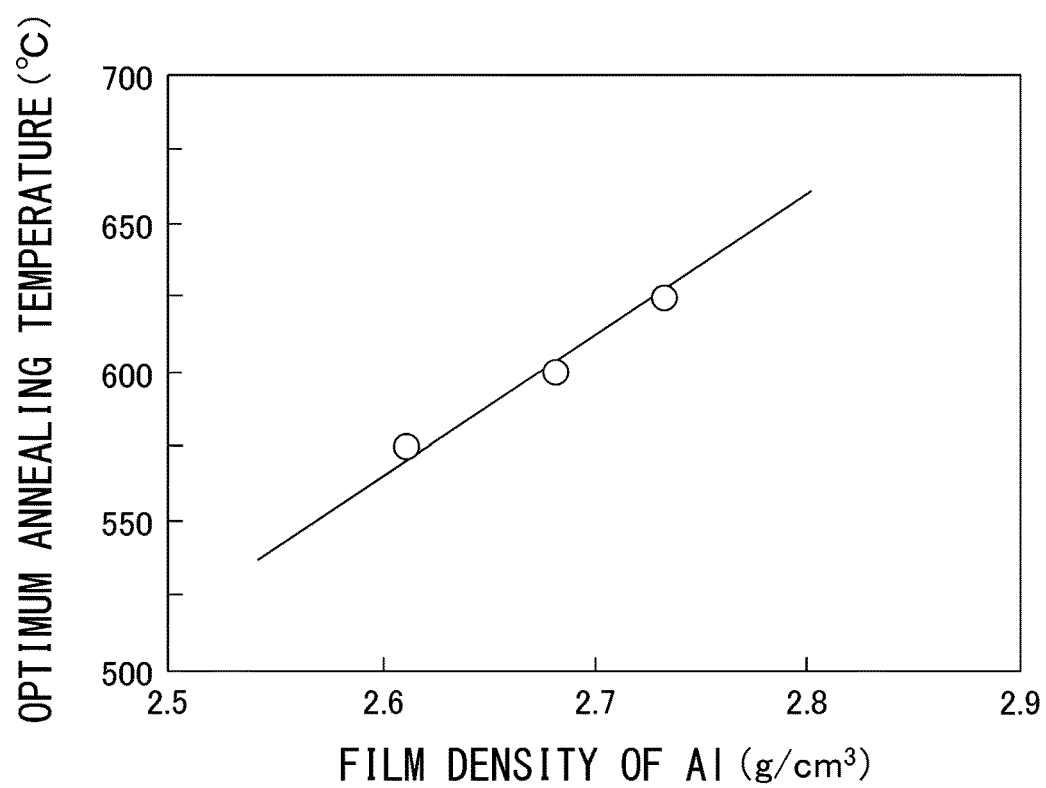
FIG. 4 is a graph showing a relationship between the film density of the second metal layer and the optimum annealing temperature.

FIG. 4 is a graph showing a relationship between the film density of the second metal layer 32b (Al layer) and the optimum annealing temperature. The term "optimum annealing temperature" means an annealing temperature at which the minimum contact resistance is obtained. The graph shows that the smaller the film thickness of the second metal layer 32b, the lower the optimum annealing temperature capable of realizing the lower contact resistance.

Figure 5:
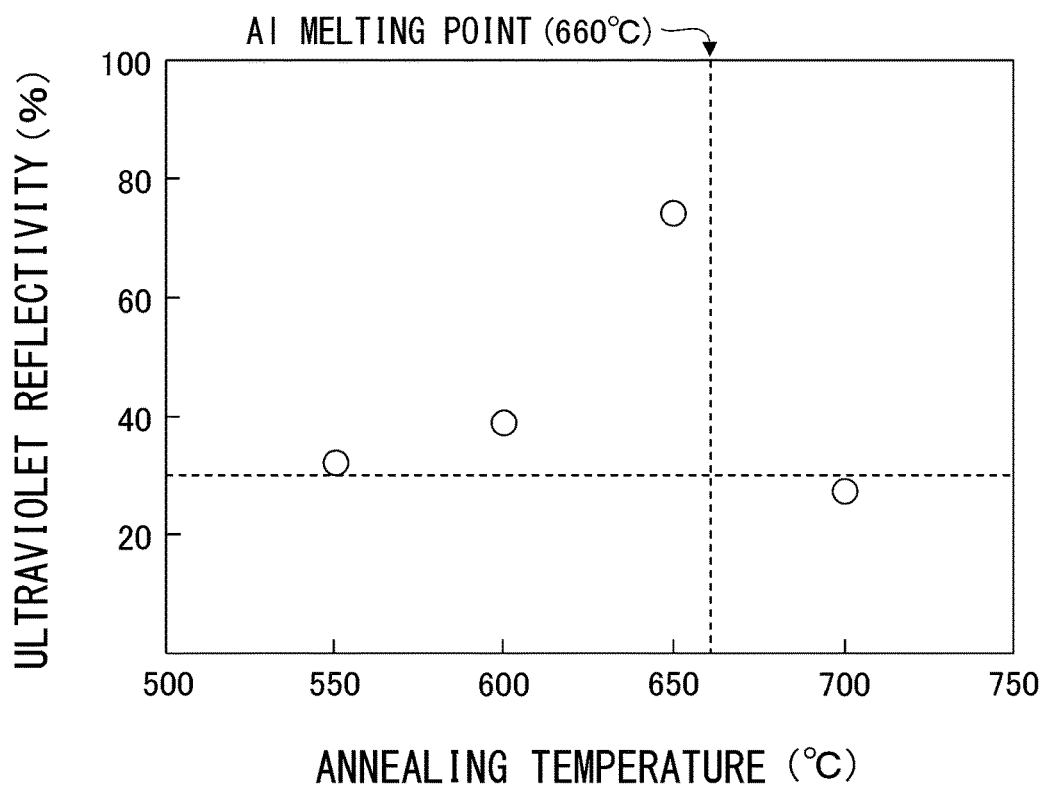
FIG. 5 is a graph showing a relationship between the annealing temperature and the ultraviolet reflectivity of the n-side electrode.

FIG. 5 is a graph showing a relationship between the annealing temperature and the ultraviolet reflectivity of the n-side electrode 32. As shown in the graph, the ultraviolet reflectivity of 30% or higher is obtained when annealing is performed at a temperature lower than the melting point of Al (about 660° C.), but the ultraviolet reflectivity is lower than 30% when annealing is performed at a temperature higher than the melting point of Al. This is considered to be because the second metal layer 32b is melted and the surface roughness of the n-side electrode 32 is increased by annealing at a higher temperature. When the n-side electrode 32 is annealed at 600° C. or lower, the arithmetic mean roughness (Ra) will be 5 nm or less so that a suitable ultraviolet reflectivity is realized. By increasing the ultraviolet reflectivity of the n-side electrode 32, the ultraviolet light reflected by the light extraction surface (second principal surface 20b) of the semiconductor light emitting element 10 and traveling toward the n-side electrode 32 is reflected at the higher reflectivity and guided toward the light extraction surface again. In this way, the external quantum efficiency of the semiconductor light emitting element 10 is increased.

Figure 6:
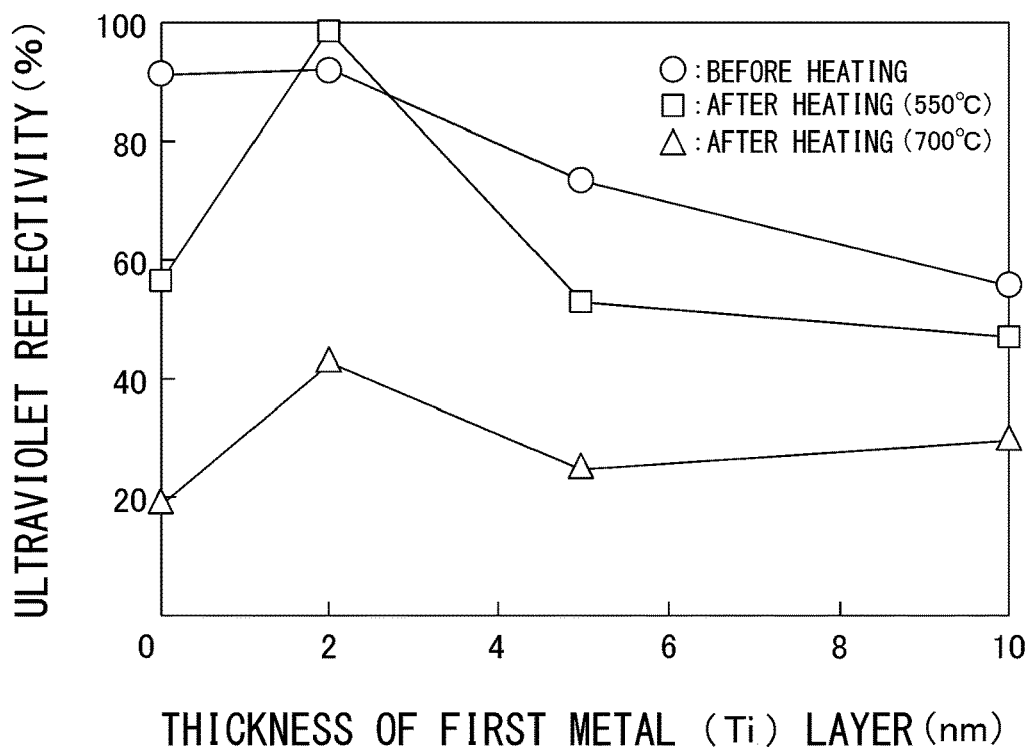
FIG. 6 is a graph showing a relationship between the thickness of the first metal layer and the ultraviolet reflectivity.

FIG. 6 is a graph showing a relationship between the thickness of the first metal layer 32a (Ti layer) and the ultraviolet reflectivity and shows variation in the ultraviolet reflectivity of the n-side electrode 32 with the change in the thickness of the first metal layer 32a and the annealing temperature. As shown in the graph, it is known that a reflectivity of the n-side electrode 32 after heating tends to drop from a reflectivity before the heating, and, in particular, the ultraviolet reflectivity drops significantly after annealing at 700° C., which exceeds the melting point of Al. It is also known that the n-side electrode 32 having an even higher ultraviolet reflectivity is obtained by configuring the thickness of the first metal layer 32a to be about 2 nm. Since the higher the ultraviolet reflectivity of the n-side electrode 32, the higher the flatness of the n-side electrode 32 tends to be, the n-side electrode 32 having the higher flatness is obtained by using the lower annealing temperature.

The graphs of FIGS. 3-6 teach that the n-side electrode 32 that meets both the requirements for lower contact resistance and higher reflectivity is obtained by configuring the film density of the second metal layer 32b (Al layer) to be lower and configuring the optimum annealing temperature to be lower. Thus, according to the embodiment, the suitable n-side electrode 32 than the related-art is obtained and the performance of the semiconductor light emitting element 10 is improved by forming the n-side electrode 32 by sputtering and configuring the film density of the Al layer to be lower.

In the temperature range 560°–650° C., in which the lower contact resistance is realized by sputtering, the lower contact resistance is obtained at a relatively lower temperature (e.g., 575° C., and the higher ultraviolet reflectivity is obtained at the relatively higher temperature (e.g., 650° C.). It is therefore preferred to select a proper annealing temperature within the range 560° C.–650° C. in accordance with the specification, etc. of the semiconductor light emitting element 10. For example, it may be preferred to select an annealing temperature of about 570°–610° C. in the case the contact resistance of the n-side electrode 32 is prioritized and select an annealing temperature 610° C.–650° C. in the case the ultraviolet reflectivity of the n-side electrode 32 is prioritized.

Described above is an explanation based on an exemplary embodiment. The embodiment is intended to be illustrative only and it will be understood by those skilled in the art that various design changes are possible and various modifications are possible and that such modifications are also within the scope of the present invention.

What is claimed is:

1. A method of manufacturing a semiconductor light emitting element, comprising:
    forming a first metal layer including titanium (Ti) on an n-type clad layer made of an n-type aluminum gallium nitride (AlGaN)-based semiconductor material;
    forming a second metal layer including aluminum (Al) on the first metal layer; and
    forming an n-side electrode by annealing the first metal layer and the second metal layer at a temperature equal to or higher than 560° C. and lower than 600° C. wherein an arithmetic mean roughness(Ra) of the second metal layer after annealing is 5 nm or less; wherein
    a film density of the second metal layer before the annealing is higher than 2.6 g/cm$^3$ and lower than 2.7 g/cm$^3$;
    the n-type clad layer has a molar fraction of aluminum nitride (AlN) of 40% or higher;
    contact resistance between the n-side electrode and the n-type clad layer is 0.01 Ω·cm$^2$ or less; and
    reflectivity of the n-side electrode for ultraviolet light entering from the n-type clad layer is 30% or higher, wherein
    the n-type clad layer includes silicon at a concentration of 1x10$^{18}$/cm$^3$ or higher, and the semiconductor light emitting element is configured to emit ultraviolet light having a wavelength of 350 nm or shorter.

2. The method of manufacturing a semiconductor light emitting element according to claim 1, wherein the second metal layer is formed by sputtering.

3. The method of manufacturing a semiconductor light emitting element according to claim 1, wherein a thickness of the first metal layer is 10 nm or less.

4. The method of manufacturing a semiconductor light emitting element according to claim 1, further comprising:
    forming an active layer made of an AlGaN-based semiconductor material on the n-type clad layer; and
    removing a portion of each of the active layer and the n-type clad layer by dry etching to expose a portion of the n-type clad layer, wherein
    the portion of the n-type clad layer is removed at an etching rate of 50 nm/minute or lower, and
    the first metal layer is formed on an exposed surface of the n-type clad layer exposed after the dry etching.

* * * * *